(12) United States Patent
McCallister et al.

(10) Patent No.: US 7,570,931 B2
(45) Date of Patent: Aug. 4, 2009

(54) RF TRANSMITTER WITH VARIABLY BIASED RF POWER AMPLIFIER AND METHOD THEREFOR

(75) Inventors: Ronald Duane McCallister, Scottsdale, AZ (US); Eric M. Brombaugh, Mesa, AZ (US)

(73) Assignee: Crestcom, Inc., Scottsdale, AZ (US)

( * ) Notice: Subject to any disclaimer, the term of this patent is extended or adjusted under 35 U.S.C. 154(b) by 615 days.

(21) Appl. No.: 11/445,816

(22) Filed: Jun. 2, 2006

(65) Prior Publication Data

US 2007/0281635 A1 Dec. 6, 2007

(51) Int. Cl.
*H01Q 11/12* (2006.01)
*H04B 1/04* (2006.01)

(52) U.S. Cl. .................... 455/126; 455/127.2

(58) Field of Classification Search ........ 455/126, 455/127.1, 127.2, 115.1; 330/278, 285, 291
See application file for complete search history.

(56) References Cited

U.S. PATENT DOCUMENTS

| | | | |
|---|---|---|---|
| 3,426,290 A | 2/1969 | Jensen |
| 3,720,880 A | 3/1973 | Le Seigneur |
| 3,961,280 A | 6/1976 | Sampei |
| 4,054,843 A | 10/1977 | Hamada |
| 4,378,530 A | 3/1983 | Garde |
| 4,507,619 A | 3/1985 | Dijkstra et al. |
| 4,831,334 A | 5/1989 | Hudspeth et al. |
| 5,251,330 A | 10/1993 | Chiba et al. |
| 5,420,536 A | 5/1995 | Faulkner et al. |
| 5,929,702 A | 7/1999 | Myers et al. |
| 6,043,707 A | 3/2000 | Budnik |
| 6,049,703 A | 4/2000 | Staudinger et al. |
| 6,141,541 A | 10/2000 | Midya et al. |
| 6,157,253 A | 12/2000 | Sigmon et al. |
| 6,256,482 B1 | 7/2001 | Raab |
| 6,600,344 B1 | 7/2003 | Newman et al. |
| 6,617,920 B2 | 9/2003 | Staudinger et al. |
| 6,696,866 B2 | 2/2004 | Mitzlaff |

(Continued)

OTHER PUBLICATIONS

Raj Desai, "Playing the 3G Power Game", www.Microsemi.com, 1999-2006.

(Continued)

*Primary Examiner*—Nguyen Vo
(74) *Attorney, Agent, or Firm*—Lowell W. Gresham; Jordan M. Meschkow; Charlene R. Jacobsen

(57) ABSTRACT

An RF transmitter (30) includes an RF power amplifier (32) for which the power input bias voltage (40) and signal input bias voltage (80) are controlled within feedback loops. A peak detector (44) generates a lowered-spectrum, peak-tracking signal (34) that follows the largest amplitude peaks of a wide bandwidth communication signal (16) but exhibits a lower bandwidth. This signal (34) is scaled in response to the operation of a drain bias tracking loop (146) then used to control a switching power supply (36) that generates the power input bias voltage. The tracking loop (146) is responsive to out-of-band power detected in a portion of the amplified RF communication signal (16"). A ratio of out-of-band power (128) to in-band power (126) is manipulated in the tracking loop (146) so that the power input bias voltage is modulated in a way that holds the out-of-band power at a desired predetermined level.

18 Claims, 7 Drawing Sheets

U.S. PATENT DOCUMENTS

| | | | |
|---|---|---|---|
| 6,725,021 | B1 | 4/2004 | Anderson et al. |
| 6,831,517 | B1 | 12/2004 | Hedberg et al. |
| 6,914,487 | B1 | 7/2005 | Doyle et al. |
| 6,975,166 | B2 | 12/2005 | Grillo et al. |
| 7,026,797 | B2 | 4/2006 | McCune, Jr. |
| 7,026,868 | B2 | 4/2006 | Robinson et al. |
| 2003/0198300 | A1 | 10/2003 | Matero et al. |
| 2004/0100323 | A1* | 5/2004 | Khanifar et al. ............... 330/51 |
| 2004/0127173 | A1 | 7/2004 | Leizerovich |
| 2004/0198271 | A1 | 10/2004 | Kang |
| 2004/0266366 | A1 | 12/2004 | Robinson et al. |
| 2005/0227644 | A1 | 10/2005 | Maslennikov et al. |
| 2006/0057980 | A1 | 3/2006 | Haque et al. |
| 2007/0087707 | A1* | 4/2007 | Blair et al. ............... 455/127.1 |
| 2007/0178856 | A1* | 8/2007 | Mitzlaff et al. ........... 455/127.1 |

OTHER PUBLICATIONS

Giles, Markendahl, Zander and Zetterberg, "Cost Drivers and Deployment Scenarios for Future Broadband Wireless Networks" Vehicular Technology Conference 2004, vol. 4, Issue 17.

B.J. Wysocki and T.A. Wysocki, "Orthogonal Binary Sequences with Wide Range of Correlation Properties", ISCTA '01, Ambleside, U.K., Jul. 2001, pp. 483-485.

A. Chan Carusone and D.A. Johns, "Analog Filter Adaptation Using a Dithered Linear Search Algorithm", IEEE Int. Symp. Circuits and Syst., May 2002.

Biranchinath Sahu and Gabriel A. Rincon-Mora, "A High- Efficiency Linear RF Power Amplifier With a Power-Tracking Dynamically Adaptive Buck-Boost Supply", IEEE, 2004, vol. 52.

Cabral, Pedro, and Carvalho, "A Unified Theory For Nonlinear Distortion Characteristics In Different Amplifier Technologies", Microwave Journal, Apr. 2005, Horizon House Pub.

Tomas Edler and Susanne Lundberg, "Energy Efficiency Enhancements in Radio Access Networks", Ericsson Review No. 1, 2004.

Sten-Magnus Jonasson, "Wireless Communications Power Needs and Challenges", APEC 2005 Conference Austin, TX, Ericsson.

Pierre Gildert, "Power System Efficiency in Wireless Communication", Jan. 2006, Ericsson.

Qun Zhao and Goran Stojcic, "Characterization of Cdv/dt Induced Power Loss in Synchronous Buck DC-DC Converters", Int'l Rectifier, APEC 2004.

Pedro and Carvalho, "Two-Tone IMD Sweet-Spots For Highly Linear Power Amplifiers Subject to Telecommunications Signals", ARFTG NVNA Users Forum @ IMS 2005, Portugal.

Hanington, Chen, Asbeck and Larson, "High-Efficiency Power Amplifier Using Dynamic Power-Supply Voltage for CDMA Application", IEEE vol. 47, No. 8 Aug. 1999.

Schlumpf, Declercq and Dehollain, "A Fast Modulator for Dynamic Supply Linear RF Power Amplifier", IEEE vol. 39, No. 7 Jul. 2004.

Wang, Hueiching, Kimball, Larson and Asbeck, "Design of Wide-Bandwidth Envelope-Tracking Power Amplifiers for OFDM Applications", IEEE, vol. 53, No. 4 Apr. 2005.

Raab, Asbeck, Cripps, Kenington, Popovich, Pothecary, Sevic and Sokal, "RF and Microwave Power Amplifier and Transmitter Technologies-Part 3", Sep. 2003.

Raab, Asbeck, Cripps, Kenington, Popovich, Pothecary, Sevic and Sokal, "Power Amplifiers and Transmitters for RF and Microwave", IEEE, vol. 50, No. 3 Mar. 2002.

Staudinger, Gilsdorf, Newman, Norris, Sadowniczak, Sherman and Quach, "High Efficiency CDMA RF Power Amplifier Using Dynamic Envelope Tracking Technique", IEEE MTT-S Digest, year of 2000.

Saleh and Cox, "Improving the Power-Added Efficiency of FET Amplifiers Operating with Varying-Envelope Signals", IEEE, vol. 31, No. 1 Jan. 1983.

Weiss, Raab and Popovich, "Linearity of X-Band Class-F Power Amplifiers in High-Efficiency Transmitters", IEEE, vol. 49, No. 6 Jun. 2001.

* cited by examiner

US 7,570,931 B2

RF TRANSMITTER WITH VARIABLY BIASED RF POWER AMPLIFIER AND METHOD THEREFOR

TECHNICAL FIELD OF THE INVENTION

The present invention relates generally to the field of radio-frequency (RF) transmitters. More particularly, the present invention relates to biasing RF power amplifiers used in RF transmitters and to the dynamic control of such biasing to achieve efficiency and linearity goals.

BACKGROUND OF THE INVENTION

An RF power amplifier provides the final stage of amplification for a communication signal that has been modulated and converted into an RF signal. Often that RF signal exhibits frequencies in a predetermined frequency band that is licensed by a regulatory agency for a particular use. The RF power amplifier boosts the power of this RF communication signal to a level sufficient so that the signal, when it propagates to an antenna, will be broadcast in such a manner that it will meet the communication goals of the RF transmitter.

Many popular modern modulation techniques, such as CDMA, QAM, OFDM, and the like, require the RF power amplifier to perform a linear amplification operation. In other words, the RF communication signal conveys both amplitude and phase information, and the RF power amplifier should faithfully reproduce both the amplitude and phase content of the RF signal presented at its input. While perfect linearity is a goal for any linear RF power amplifier, all linear RF power amplifiers invariably fail to meet it. The degree to which the goal of perfect linearity is missed leads to unwanted intermodulation, nonlinearities, and spectral regrowth.

The regulatory agencies that license RF spectrum for use by RF transmitters define spectral masks with which transmitters should comply. The spectral masks set forth how much RF energy may be transmitted from the RF transmitters in specified frequency bands. As transmitter technology has advanced, and as increasing demands have been placed on the scarce resource of the RF spectrum by the public, the spectral masks have become increasingly strict. In other words, very little energy outside of an assigned frequency band is permitted to be transmitted from an RF transmitter. The trend is for further out-of-band transmission restrictions in the future. Accordingly, unless the spectral regrowth that results from any nonlinearity in the amplification performed by an RF power amplifier is held to a very low level, the RF transmitter will be in violation of its regulatory spectral mask.

In conventional RF power amplifiers, the linearity parameter is counterbalanced against power-added efficiency. Power-added efficiency, hereinafter referred to simply as "efficiency", is the ratio of the RF output power to the sum of the input RF power and the applied direct-current (DC) power. In conventional RF transmitters, improvements in efficiency have been achieved at the expense of linearity.

Amplifiers are often classified into various classes, depending upon how they are operated and upon a conduction angle parameter. The conduction angle is the portion of a complete RF signal cycle over which an amplifier operates or conducts. Class A operation corresponds to amplifier conduction over an entire RF cycle (i.e., a 360° conduction angle); class B operation corresponds to amplifier conduction over only half of an entire RF cycle (i.e., a 180° conduction angle); class AB operation corresponds to amplifier conduction between class A operation and class B operation (i.e., 180°-360° conduction angle); and, classes C-F all have conduction angles less than 180°. Classes A, AB, and B are all considered suitable for linear amplification applications but are less efficient than classes C-F. The higher classes (e.g., C-F) are deemed to be nonlinear classes and are more efficient, often much more efficient. Each linear class is less efficient than all nonlinear classes. Class A is both the most linear class of operation and the least Efficient.

A need exists to achieve RF power amplifier linearity consistent with strict, modern regulatory spectral masks, but at the same time improve efficiency. One application where this need is felt is in connection with cellular handsets. A cellular handset is a battery-operated device. So, improved efficiency translates directly into either longer battery charge-retention times, or the use of smaller batteries and the provision of smaller cell phones. But cellular handsets transmit signals at relatively low power levels (typically less than 1 W peak) and over a relatively narrow bandwidth (typically less than 5 MHz). This low power and low bandwidth application affords the opportunity to trade a small amount of linearity degradation for significant efficiency improvements.

Another application that needs RF power amplifier linearity consistent with strict, modern regulatory spectral masks and at same time as much efficiency as possible is a cellular basestation. A significant percentage of the overall lifecycle costs of a typical cellular basestation is dedicated to purchasing electrical power, and the RF power amplifier is one of the largest power consumers in the cellular basestation. As upfront costs for placing cellular base stations in service diminish, this on-going power cost is expected to become a larger portion of the overall lifecycle costs.

Cellular basestations tend to be high power RF transmitter applications (e.g., greater than 5 W and often much greater). In general, a cellular basestation should be capable of transmitting at a power level roughly equal to the sum of the power levels at which a maximum number of cellular mobile stations that can communicate with it transmit. The number of mobile stations active at any instant can vary widely, placing a wide dynamic range over the transmission power requirements of the basestation.

Moreover, it has become popular to combine the signals from several different channels within a cellular basestation's RF transmitter to form a multichannel signal having a wide bandwidth (e.g., greater than 10 MHz). While a compatible mobile station need transmit in only one of the channels at any instant, the basestation will transmit in multiple channels simultaneously, and its RF power amplifier should linearly amplify over a wide bandwidth that encompasses all of the channels. The use of multichannel signals also causes a peak-to-average power ratio (PAPR) of such signals to increase to extreme levels. In other words, rarely occurring signal peaks can be at far greater amplitudes than the average signal amplitude. And, these rarely occurring extreme peaks can appear and diminish at a rapid rate compatible with the wide bandwidth.

A variety of RF power amplifier efficiency enhancements related to variably biased RF power amplifiers have been proposed, at least for low power, narrow bandwidth applications. Biasing relates to the typical DC voltages and currents that are applied to power inputs and signal inputs of amplifiers so that they will reproduce an input signal in a desired manner. Using Lateral Diffusion Metal Oxide Semiconductor (LD-MOS) field-effect transistor (FET) terminology, the biasing refers to typically DC voltages applied to the drain and gate of an LDMOS, FET, RF power amplifier. For conventional variably biased RF power amplifiers, these bias voltages are modulated to achieve improved efficiency with the goal of harming linearity as little as possible.

With the envelope-elimination and restoration (EER) technique, also known as the Kahn technique, the amplitude component of a communication signal is separated from the phase component. Then, the phase component is amplified in a highly efficient amplifier configured for a nonlinear class of operation. The amplitude component is restored by varying the bias voltage at the power input (e.g., the drain) of the nonlinear class amplifier commensurate with the amplitude component of the communication signal. In a narrowband, low power application, the EER technique achieves significant efficiency enhancement over the linear classes of operation. But a significant price is typically paid in linearity. The EER technique is not used in high power and wide bandwidth applications because, rather than realizing efficiency enhancement, efficiency deterioration is the likely result along with reduced linearity. Efficiency deterioration would result from attempting to generate a high power bias voltage that exhibits a bandwidth consistent with the amplitude content of a wide bandwidth signal.

Another variably biased RF power amplifier technique is the envelope-following technique. Envelope following differs from the EER technique in that both the amplitude and phase components of the communication signal are amplified in a linear-class amplifier. But like the EER technique, power input bias voltage is varied in a manner commensurate with the amplitude content of the communication signal. Accordingly, bias voltage need not be greater than it needs to be to accommodate the RF signal being amplified in a linear class of operation on an instant-by-instant basis. Efficiency enhancements result when compared to traditional linear-class amplifier operation using static DC biasing voltages. Typically, timing issues are less critical than in the EER technique, and the linearity deterioration is less severe than in the EER technique as a result. But a linearity penalty still results, and the envelope-following technique is not used in high power and wide bandwidth applications because, rather than realizing efficiency enhancement, efficiency deterioration is the likely result.

Another variably biased RF power amplifier technique is the envelope-tracking technique. Envelope tracking differs from the envelope-following technique in that the envelope of the RF communication signal is not followed completely. This lowers the switching frequency requirements in the power supply that generates the bias voltage applied to the RF power amplifier's power input, resulting in some efficiency gain to offset an efficiency loss suffered by not completely following the envelope. And, timing issues become less critical, at least in narrow bandwidth applications, so that linearity need not suffer greatly. But a linearity penalty still results, and nothing is provided to ensure that the linearity penalty does not result in the violation of a spectral mask.

These efficiency enhancements have had little success in connection with a high power, wide bandwidth application, such as in a cellular basestation. On the other hand, while a cellular basestation's RF transmitter should be able to linearly amplify even the rare extreme peak amplitudes, the fact that these peaks occur so rarely affords an opportunity to benefit from efficiency enhancements because it is the average power level that influences power costs.

With modern strict spectral masks, what is needed is an efficiency enhancement that does not simply trade-off linearity for power efficiency but that actively manages linearity and efficiency together so that as much efficiency as practical can be achieved without violating the spectral mask. And, the efficiency enhancement should be usable even in a high power, wide bandwidth application.

SUMMARY OF THE INVENTION

It is an advantage of at least one embodiment of the present invention that an improved RF transmitter with a variably biased RF power amplifier and a corresponding method of operating the RF transmitter are provided.

Another advantage of at least one embodiment of the present invention is that a variably biased RF transmitter and method are provided for use even in a high power, wide bandwidth application, such as a cellular basestation.

Another advantage of at least one embodiment of the present invention is that a variably biased RF transmitter and method are provided which actively manage RF power amplifier linearity to achieve as much RF power amplifier efficiency as practical while meeting regulatory spectral mask constraints.

Another advantage of at least one embodiment of the present invention is that a variably biased RF transmitter and method are provided which actively manage RF power amplifier linearity to maintain out-of-band power below or equal to a predetermined level so that regulatory spectral mask constraints can be maintained.

Another advantage of at least one embodiment of the present invention is that a variably biased RF transmitter and method are provided which actively manage RF power amplifier linearity to maintain out-of-band power above or equal to a predetermined level so that as much RF power amplifier efficiency enhancement as possible can be achieved without violating regulatory spectral mask constraints.

Another advantage of at least one embodiment of the present invention is that a variably biased RF transmitter and method are provided which repeatedly make RF power amplifier linearity/efficiency transactions. When linearity may be degraded, linearity is "sold" in exchange for as much efficiency gain as possible, and when linearity needs to be improved, linearity is "bought" in exchange for as little efficiency loss as possible.

At least some of these and other advantages are realized in one form by an RF transmitter configured to transmit an RF signal within a predetermined frequency band using a variably biased RF power amplifier. The RF transmitter includes a power source. An RF power amplifier having a power input, a signal input, and a signal output is provided along with a switching element. The switching element is coupled between the power source and the power input of the RF power amplifier, and the switching element supplies a bias voltage to the RF power amplifier. A communication-signal source is configured to supply a communication signal, and the communication-signal source is coupled to the signal input of the RF power amplifier. A peak detector has an input coupled to the communication-signal source and an output. An out-of-band power estimator has an input coupled to the output of the RF power amplifier and has an output. The out-of-band power estimator is configured to estimate power occurring outside of the predetermined frequency band. A control section has a first input coupled to the output of the peak detector, a second input coupled to the output of the out-of-band power estimator, and an output coupled to the switching element. The control section is configured to adjust the bias voltage supplied to the RF power amplifier so that the out-of-band power estimated by the out-of-band power estimator is less than or equal to a predetermined power level.

At least some of the above and other advantages are realized in another form by a method of managing bias voltage for an RF power amplifier in an RF transmitter. The method calls for maintaining a plurality of coefficients, wherein each of the coefficients influences transmitter efficiency and RF power amplifier linearity. An efficiency signal is generated to be responsive to transmitter efficiency, and a linearity signal is generated to be responsive to RF power amplifier linearity. When the linearity signal indicates RF power amplifier linearity greater than a predetermined level, one of the plurality of coefficients is altered. The coefficient that is altered is the one that achieves the least change in RF power amplifier linearity per unit change in transmitter efficiency. When the linearity signal indicates RF power amplifier linearity less than the predetermined level, one of the plurality of coefficients is altered. The coefficient that is altered is the one that achieves the greatest change in linearity per unit change in transmitter efficiency.

The above and other advantages are realized in another form by a method of managing bias voltage for an RF power amplifier in an RF transmitter. The method calls for providing a switching power supply to generate the bias voltage for the RF power amplifier. From an amplified signal generated by the RF power amplifier, the method estimates out-of-band power, which represents a portion of the power realized in the amplified signal outside a predetermined frequency band. A feedback loop is operated in which the bias voltage changes to maintain an average of said out-of-band power greater than a predetermined power level.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
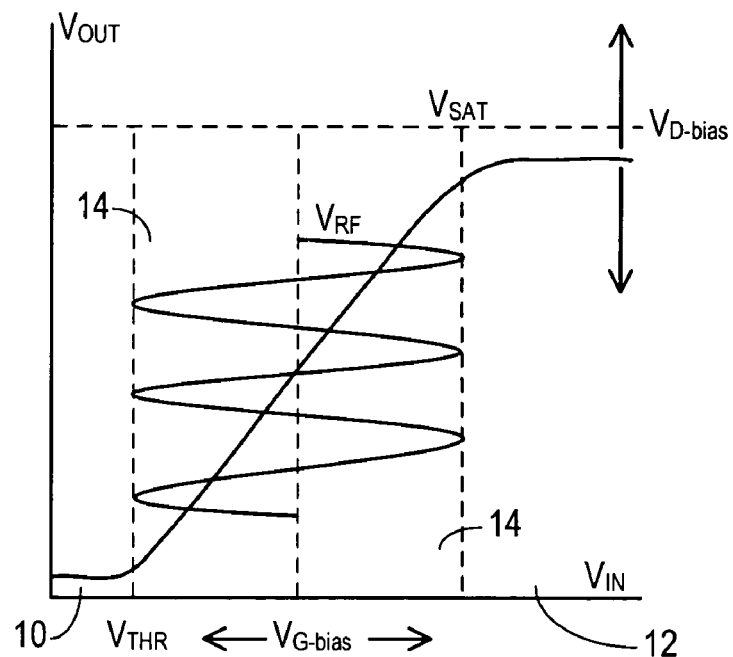
FIG. 1 shows a chart that graphically depicts transfer characteristics of a typical RF power amplifier biased to operate at or near class A operation.

FIG. 1 shows a chart that graphically depicts transfer characteristics of a typical RF power amplifier. In the preferred embodiment of the present invention, an RF power amplifier, discussed in more detail below, is biased for substantially class A operation, and the chart of FIG. 1 depicts this class A operation. Three potential regions of operation are depicted. In a cutoff region 10, the input voltage is beneath a threshold ($V_{THR}$), and regardless of the precise input voltage, the output voltage exhibits the same low level. In a saturation region 12, the input voltage is greater than a predetermined level, but regardless of the precise input voltage, the output exhibits substantially the same high level. The size of cutoff region 10 is primarily determined by the semiconductor and other architectural characteristics of the RF power amplifier.

But the point at which the RF power amplifier transitions into saturation region 12 is determined in part by a bias voltage ($V_{D-bias}$) because a saturation voltage $V_{SAT}$ is a small amount less than this bias voltage. Using LDMOS terminology, this bias voltage is the drain bias voltage. But those skilled in the art will appreciate that the teaching of the present invention is applicable to a wide variety of semiconductor technologies and that the nomenclature applied for LDMOS may not be applicable in other technologies. Accordingly, the drain, which corresponds to a collector using Heterojunction Bipolar Transistor (HBT) terminology, will be referred as a power input herein, and the gate, which corresponds to a base using HBT terminology, will be referred to as a signal input herein. If the power input bias voltage is increased, the point at which amplifier operation transitions into saturation region 12 likewise increases, and if the power input bias voltage decreases, the point at which operation transitions into saturation region 12 likewise decreases. As the power input voltage and the saturation point levels vary, the amplifier gain remains substantially constant.

For class A operation, the input and output signals for the RF power amplifier should be maintained between cutoff region 10 and saturation region 12 at all times. This is a linear region 14 of operation. Within linear region 14, the amplifier output is proportional to the input, and that proportion remains substantially constant regardless of the signal amplitude. Classes of operation other than Class A result when the RF power amplifier is biased so that at least a portion of the signal being amplified extends into either cutoff region 10 or saturation region 12.

For class A operation, the RF amplifier's power draw from its power input is proportional to its power input voltage, regardless of signal amplitude. At higher signal amplitudes more power is transmitted toward an antenna, and at lower signal amplitudes more power is consumed or wasted in the RF power amplifier itself. The highest or best instantaneous efficiency results at the instants when the highest peak-amplitude signal is amplified. At these instants, another bias voltage applied to the signal input of the RF power amplifier ($V_{G-bias}$) is desirably precisely centered in linear region 14. Otherwise the peaks of the signal being amplified will enter cutoff and saturation regions 10 and 12. At maximum efficiency, the peaks of the signal being amplified will extend within linear region 14 just to, but not into, either of cutoff or saturation regions 10 and 12. The lowest or worst efficiency results at instants when the lowest peak-amplitude signal is amplified. At these instants, the peaks of the signal being amplified are close to one another, and it is less important where in linear region 14 the signal resides so long as the peaks do not extend into cutoff or saturation regions 10 or 12.

In a preferred embodiment of the present invention, the bias voltage applied at the power input of the RF power amplifier and the bias voltage applied at the signal input of the RF power amplifier are varied so that the RF power amplifier operates in classes A and AB at substantially all times and so that the peaks of the signal being amplified remain as near to cutoff region 10 and saturation region 12 as practical within constraints imposed by power and bandwidth requirements.

Figure 2:
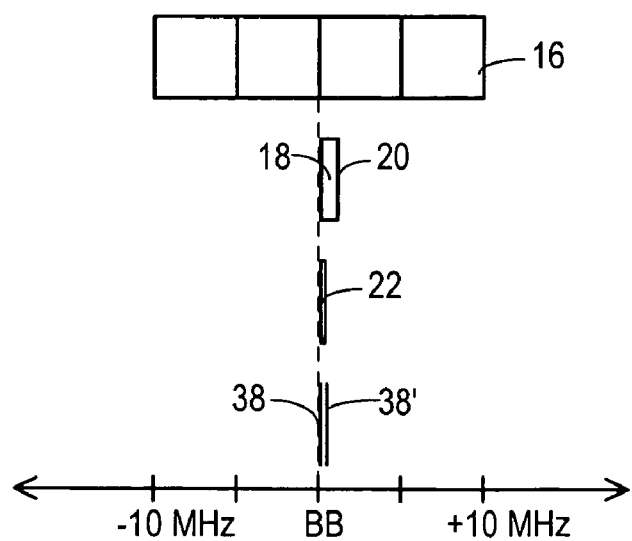
FIG. 2 shows a chart that graphically depicts relative bandwidths between a communication signal, a switching power supply's switching frequency band, and a switching power supply loop bandwidth.

FIG. 2 shows a chart that graphically depicts relative bandwidths between a communication signal, a switching power supply's switching frequency band, and a switching power supply loop bandwidth. FIG. 2 illustrates some of the bandwidth constraints within which a preferred embodiment of the present invention operates. In particular, a communication signal 16 is depicted as being consistent with the requirements of a multichannel, WCDMA, cellular basestation, communication signal. Four distinct channels are depicted, with each channel occupying its own roughly 5 MHz bandwidth. FIG. 2 depicts communication signal 16 centered at a baseband (BB) frequency of 0 Hz, and extending roughly ±10 MHz on either side of 0 Hz because communication signal 16 is processed within the RF transmitter using complex signal processing techniques. Due to this wide (i.e., greater than 10 MHz) bandwidth and to the multichannel nature of communication signal 16, extremely large signal peaks may appear from time-to-time, although they should occur rarely. And, when they occur they may appear rapidly. In other words the RF carrier, which may exhibit a frequency of up to around the 2 GHz range, may increase in amplitude to one of these large signal peaks in the inverse of this bandwidth, or about 50 nanoseconds.

FIG. 2 also depicts a bandwidth 18 within which switching elements of conventional switching power supplies switch. This bandwidth is less than one-fifth of the bandwidth of communication signal 16, and is typically less than one-twentieth. It would be convenient if switching power supplies performed their switching operations over a greater bandwidth because they could then track and respond to transients more quickly. But their power efficiency decreases dramatically if operated outside of bandwidth 18, which typically has a maximum switching frequency 20 of less than 1 MHz. And, as the amount of power supplied by switching power supplies increases, this tendency toward diminished efficiency likewise increases. In short, operation of a switching power supply at a bandwidth above bandwidth 18 in a high power, wide bandwidth application, such as a multichannel cellular basestation, would negate and quite possibly reverse any efficiency improvements to be achieved by variably biasing the RF power amplifier. FIG. 2 graphically illustrates that the bandwidth of a conventional switching power supply is far less than would be needed to respond to rapidly occurring peaks of communication signal 16.

FIG. 2 also depicts a loop bandwidth 22 of a typical switching power supply. As is typical for a switching power supply, loop bandwidth 22 is considerably less than maximum switching frequency 20 for a switching power supply. Using typical switching power supply techniques, loop bandwidth 22 is roughly one-half to one-tenth of maximum switching frequency 20. Thus, loop bandwidth 22 is far less than needed to respond to rapidly occurring peaks of communication signal 16.

Figure 3:
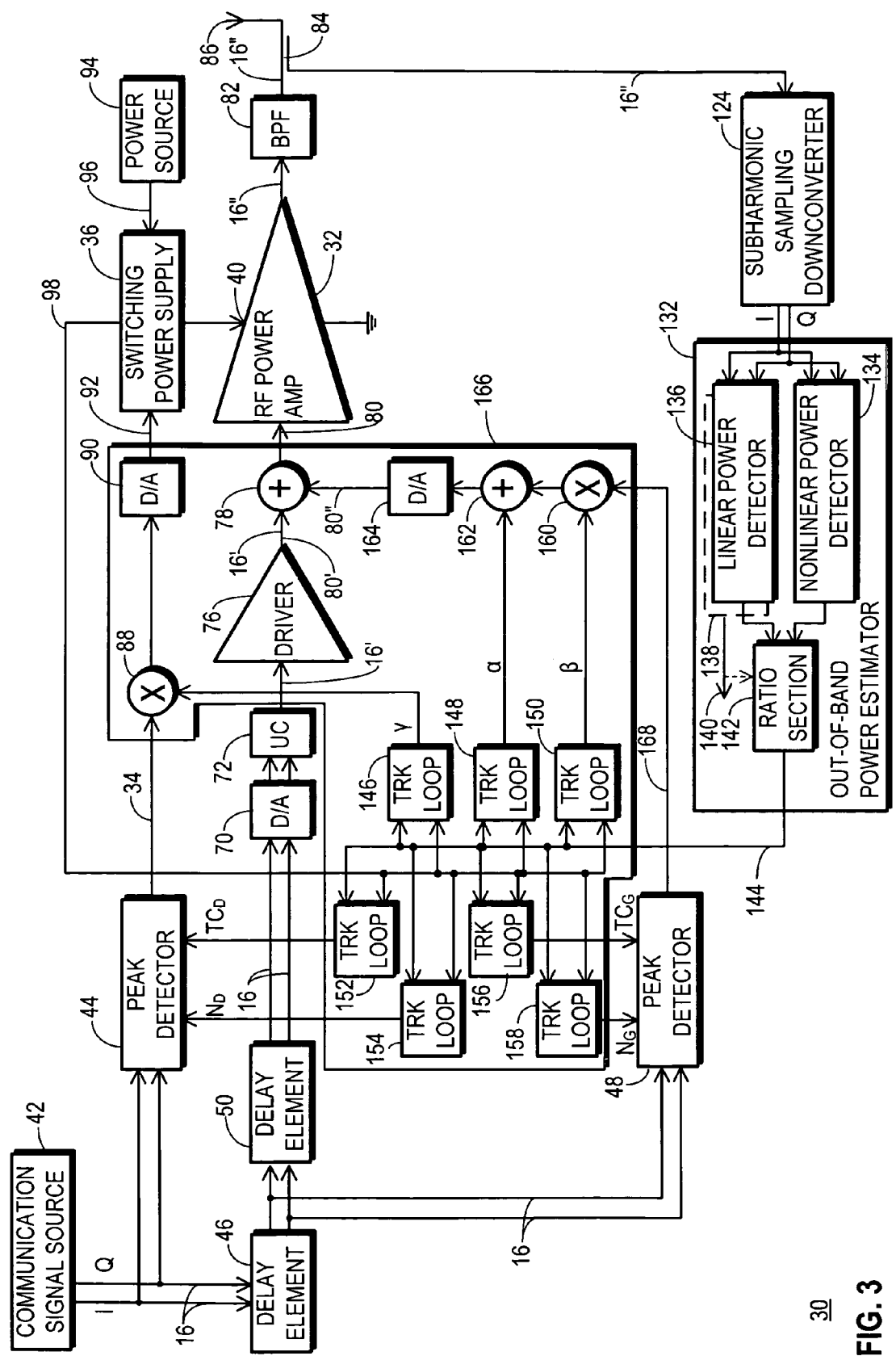
FIG. 3 shows a block diagram of a preferred embodiment of an RF transmitter having a variably biased RF power amplifier and being configured in accordance with the teaching of the present invention.

FIG. 3 shows a block diagram of a preferred embodiment of an RF transmitter 30 having a variably biased RF power amplifier 32 and being configured in accordance with the teaching of the present invention. In general, RF transmitter 30 generates a lowered-spectrum, peak-tracking signal 34 from communication signal 16. In lowered-spectrum signal 34, the spectral content of communication signal 16 is lowered enough so that a switching power supply 36 having a loop bandwidth 22 (FIG. 2) can track lowered-spectrum signal 34. In FIG. 2, a trace 38 represents a fundamental frequency for lowered-spectrum signal 34. This fundamental frequency is compatible with loop bandwidth 22.

Switching power supply 36 supplies bias voltage to a power input 40 of RF power amplifier 32 in response to lowered-spectrum signal 34. In addition, one or more feedback tracking loops are provided to make continuous adjustments to the way in which switching power supply 36 responds to lowered-spectrum signal 34. These adjustments may be viewed in two ways. They prevent the pursuit of RF power amplifier efficiency from causing excessive spectral emissions outside of a predetermined frequency band where RF transmitter 30 is licensed to operate. And, they prevent the pursuit of improved linearity from limiting RF power amplifier efficiency.

Referring to FIG. 3 in more detail, a communication signal source 42 supplies communication signal 16 substantially at a baseband frequency. In the preferred embodiment, communication signal source 42 is implemented digitally, and communication signal 16 is a digital communication signal. Moreover, communication signal 16 is a complex signal having orthogonal in-phase (I) and quadrature phase (Q) signal components.

Communication signal source 42 may apply a variety of processing techniques prior to supplying communication signal 16. For example, communication signal 16 may have been digitally modulated in accordance with CDMA, QAM, OFDM, or other modulation techniques. Pulse shaping may have been performed to spread the energy from any single unit interval over a plurality of unit intervals in a manner that reduces the likelihood of inter-symbol interference but does not hinder data recovery at the reception end. Processing may have been performed to reduce the peak-to-average power ratio of communication signal 16. Other processing may have been performed to predistort communication signal 16 to enhance the effective linearity of RF power amplifier 32. Any or all of these and other digital signal processing techniques known to those skilled in the art may be applied by communication signal source 42. In addition, the signal environment for communication signal 16 can vary over time. For example, the multi-carrier channel's amplitude increases and decreases as users enter, move, and leave the service area of transmitter 30. Due, at least in part, to this dynamic nature of communication signal 16, optimum parameters used in biasing RF power amplifier 32 at one instant may not be optimum in the next. Accordingly, such parameters are desirably tracked, as discussed in more detail below.

An output of communication signal source 42 couples to inputs of a peak detector 44 and of a delay element 46. An output of delay element 46 couples to inputs of a peak detector 48 and of a delay element 50. Peak detectors 44 and 48 and delay elements 46 and 50 are all implemented digitally in the preferred embodiment. Accordingly, peak detectors 44 and 48 and delay elements 46 and 50 process data at a rate adequate to satisfy Nyquist constraints.

Figure 4:
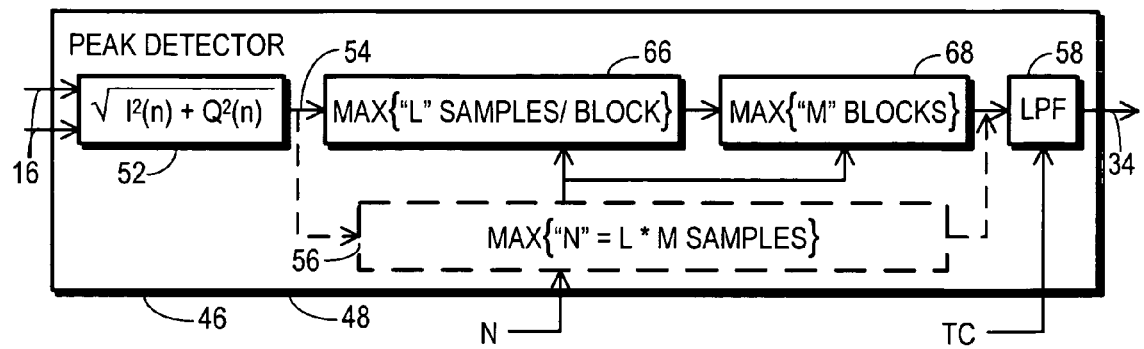
FIG. 4 shows a block diagram of a peak detector that may be used within the RF transmitter of FIG. 3.
Figure 5:
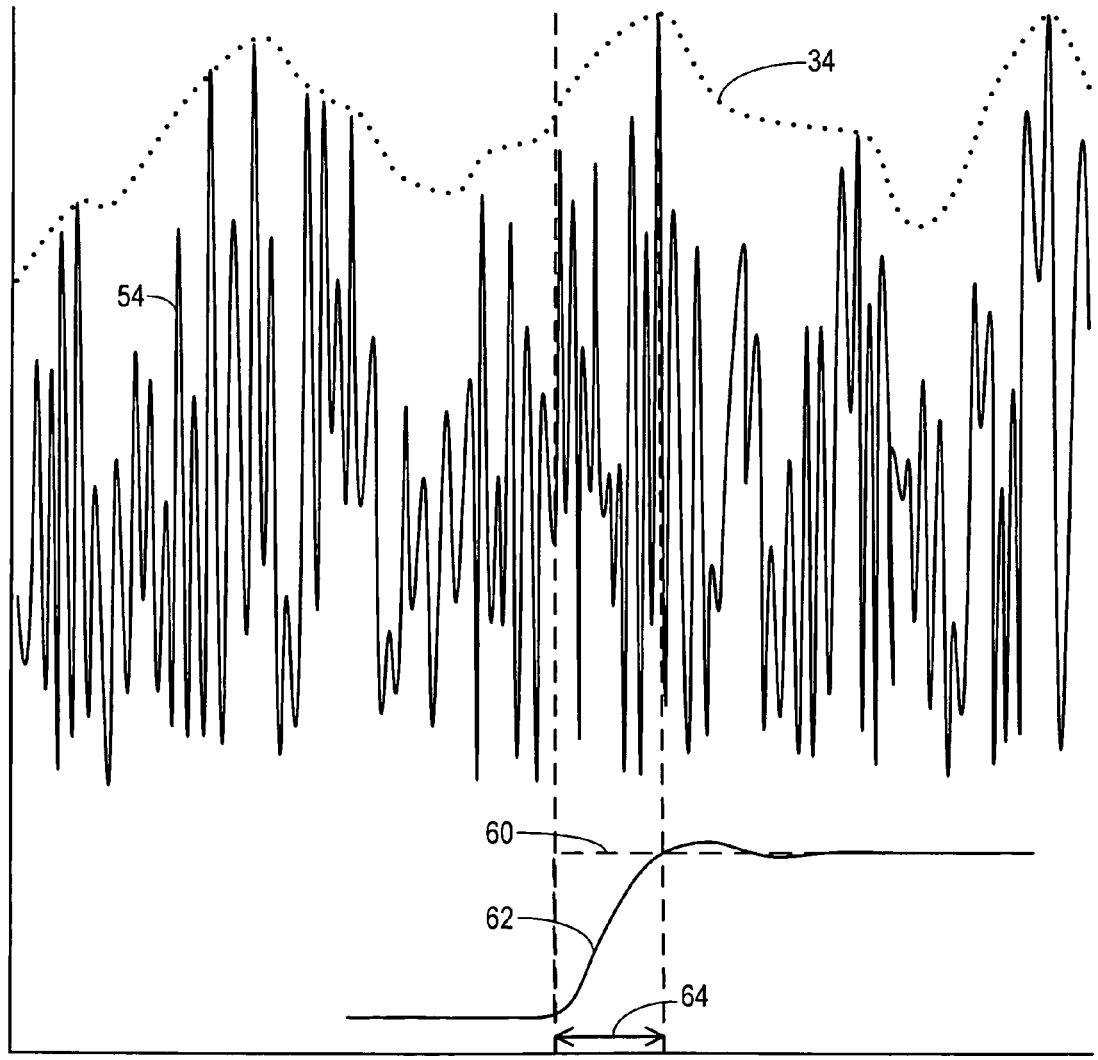
FIG. 5 shows a chart that graphically depicts a temporal plot of an RF multichannel communication envelope signal.

FIG. 4 shows a block diagram of one embodiment of a peak detector that may be used within RF transmitter 30 for either of peak detectors 44 or 48. FIG. 5 shows a chart that graphically depicts a temporal plot of the envelope of an RF multichannel communication signal. Referring to FIGS. 4 and 5, within the peak detector communication signal 16 drives a magnitude detector 52 which, on a sample-by-sample basis, calculates the instantaneous magnitude of the sample stream that conveys communication signal 16. This instantaneous magnitude (i.e., the envelope) is expressed in RF multichannel communication envelope signal 54. The graphical depiction an exemplary communication envelope signal 54 in FIG. 5 may cover around 1200 samples on its horizontal axis, showing the lively dynamic nature of the amplitude content of communication signal 16. Roughly speaking, envelope signal 54 exhibits a bandwidth about twice that of baseband communication signal 16.

In a less preferred, but conceptually straight-forward, embodiment a maximum sample detector 56 receives envelope signal 54 and identifies the greatest peak that has occurred in envelope signal 54 within the last "N" samples. This less preferred embodiment is depicted in FIG. 4 using a dotted-line box. In one embodiment, the constant "N" is controlled by a tracking loop (discussed below) that roughly controls "N" to correspond to the reduction in bandwidth needed between lowered-spectrum, peak-tracking signal 34 (FIG. 3) and communication signal 16. But in other embodiments, "N" may simply be provided as a constant. With a loop bandwidth 22 (FIG. 2) of around 100 KHz for switching power supply 36 (FIG. 3) and a bandwidth of around 20 MHz for communication signal 16, "N" may be on the order of 200-800 samples. This maximum peak within a timing window of "N" samples serves as the output of maximum detector 56 until an even greater peak is encountered or until the window of "N" samples has transpired. At all instants, the output of maximum detector 56 equals the maximum signal envelope value over the past "N" samples. The output of maximum detector 56 is then filtered in a low-pass filter (LPF) 58 having a time constant (TC) compatible with the loop bandwidth 22 of power supply 36. Or, if the function of low-pass filter 58 is included within switching power supply 36, either explicitly or implicitly, then low-pass filter 58 may be omitted. In one embodiment, this time constant is controlled by a tracking loop (discussed below) that roughly controls "TC" to correspond to the loop bandwidth of power supply 36. But in other embodiments, "TC" may simply be provided as a constant. The output of low-pass filter 58 provides lowered-spectrum, peak tracking signal 34, depicted as a dotted line in FIG. 5.

For comparison purposes, FIG. 5 also shows a step track 60 and a second-order, low-pass filter response 62 to step track 60. Response 62 roughly models the response of a hypothetical switching power supply 36 to a hypothetical control signal resembling step track 60. A delay 64 is commensurate with loop bandwidth 22 of power supply 36 and is responsive to maximum switching frequency 20 of a switching element within power supply 36. FIG. 5 shows that response 62 is far too slow to respond to envelope signal 54, but is compatible with lowered-spectrum, peak-tracking signal 34.

In a more preferred implementation of maximum detector 56, the timing window variable "N" is recognized as being the product of "L" samples per block of samples times "M" blocks of samples. Thus, envelope signal 54 drives a first maximum detector 66 that detects the maximum value of samples in each of "M" blocks, where each block has "L" contiguous samples. Then, the output of maximum detector 66 drives a second maximum detector 68 that detects the maximum sample from among the "M" blocks, and uses that maximum to drive low-pass filter 58. This configuration is more preferred due to its simpler implementation, but otherwise generates a less temporally accurate result.

The difference between peak detector 44 and peak detector 48 is in the values of their respective timing window variables "N" and their respective time constant variables "TC". Both timing window variable "N" and time constant variable "TC" are typically shorter for peak detector 48. Peak detector 44 is most likely the slower of the two peak detectors, and it is used to control bias voltage for power input 40 of RF power amplifier 32, while peak detector 48 the faster of the two peak detectors and is used to control bias voltage for a signal input of RF power amplifier 32.

Those skilled in the art will appreciate that the FIG. 4 implementations are but two of a wide variety of suitable peak detector configurations for peak detectors 44 and/or 48. In general, any peak detector configuration directed toward the following three goals will be adequate for the purposes of RF transmitter 30. First, lowered-spectrum signal 34 should remain at a greater amplitude than envelope signal 54 at substantially all samples. Second, lowered-spectrum signal 34 should remain at as low an amplitude as possible for as long as possible without violating the first goal. And third, lowered-spectrum signal 34 should exhibit a fundamental frequency sufficiently low that switching power supply 36 can track it, without violating the first and second goals.

Delay elements 46 and 50 (FIG. 3) collectively implement a delay that roughly equals the sum of delay 64 (FIG. 5) plus one-half of N samples (FIG. 4). Assuming that peak detector 44 reacts instantly to the detection of a peak in envelope signal 54 (FIG. 5) but that switching power supply 36 needs a significant amount of time (e.g., delay 64) to generate the bias voltage desired for the peak, this amount of delay will cause communication signal 16 to appear at a signal input to RF power amplifier 32 about when the bias voltage is at its desired level. Tracking loops, discussed below, will further apply gain and/or delay to lowered-spectrum, peak-tracking signal 34 as needed to achieve the desired results.

Referring back to FIG. 3, the digital, complex, baseband version of communication signal 16, now delayed in delay elements 46 and 50, is provided to a digital-to-analog (D/A) section 70 that converts communication signal 16 into an analog form and passes the analog form of communication signal 16 to an upconverter (UC) section 72. In upconverter section 72, communication signal 16 is shifted upwards in frequency to its assigned RF frequency band, the complex legs are combined together, and the result is band-pass filtered. The result is an RF form 16' of communication signal 16.

Figure 6:
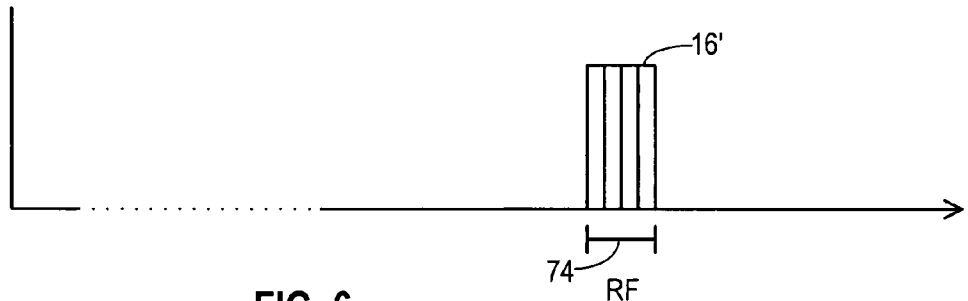
FIG. 6 shows a chart that graphically depicts a spectral plot of an RF multichannel communication signal.

FIG. 6 shows a chart that graphically depicts a spectral plot of RF multichannel communication signal 16' output from upconverter 72. FIG. 6 shows that RF communication signal 16' now resides in an allocated frequency band 74 and that substantially none of RF communication signal 16' resides outside of frequency band 74.

Referring back to FIG. 3, the RF communication signal 16' output from upconverter 72 is supplied to a driver amplifier 76 where it receives first-stage amplification. From driver amplifier 76 at an output node 80', RF communication signal 16' is presented to a combining element 78 where it is combined with a signal-input bias voltage from a node 80" and then passed to a signal input 80 of RF power amplifier 32.

An output of RF power amplifier 32 generates an amplified RF communication signal 16" and couples to an input of a band-pass filter (BPF) 82. An output of band-pass filter 82 couples to a directional coupler 84 where a small portion of amplified RF communication signal 16", now band-pass filtered, is routed to one or more feedback circuits. The vast majority of energy in amplified RF communication signal 16" passes through coupler 84 to an antenna 86 from which it is broadcast.

An output of peak detector 44 is a digital signal that is routed to a first input of a scaling circuit 88. An output of scaling circuit 88 drives a digital-to-analog (D/A) converter 90, which has an output that couples to a control input 92 of switching power supply 36. A power source 94 provides a power signal to a power input 96 of switching power supply 36, and an output of switching power supply 36 couples to power input (e.g., a drain or collector) 40 of RF power amplifier 32. In the preferred embodiment, power source 94 represents any convenient source of a DC voltage capable of meeting the power requirements of RF transmitter 30. That source may be derived from an AC power distribution network, battery, solar panel, generator, or the like.

An output 98 of switching power supply 36 provides a digital indication of the current being drawn from power source 94 and couples to tracking loops, discussed below. Switching power supply 36 converts the voltage from power source 94 into a voltage desirable for use in biasing power input 40 of RF power amplifier 32. This voltage that is desirable for biasing is responsive to the input signal at control input 92. As discussed above in connection with FIG. 1, the desirable bias voltage for power input 40 causes the highest peaks of RF communication signal 16' within RF power amplifier 32 at each particular instant to extend just to, but not into, saturation region 12.

Figure 7:
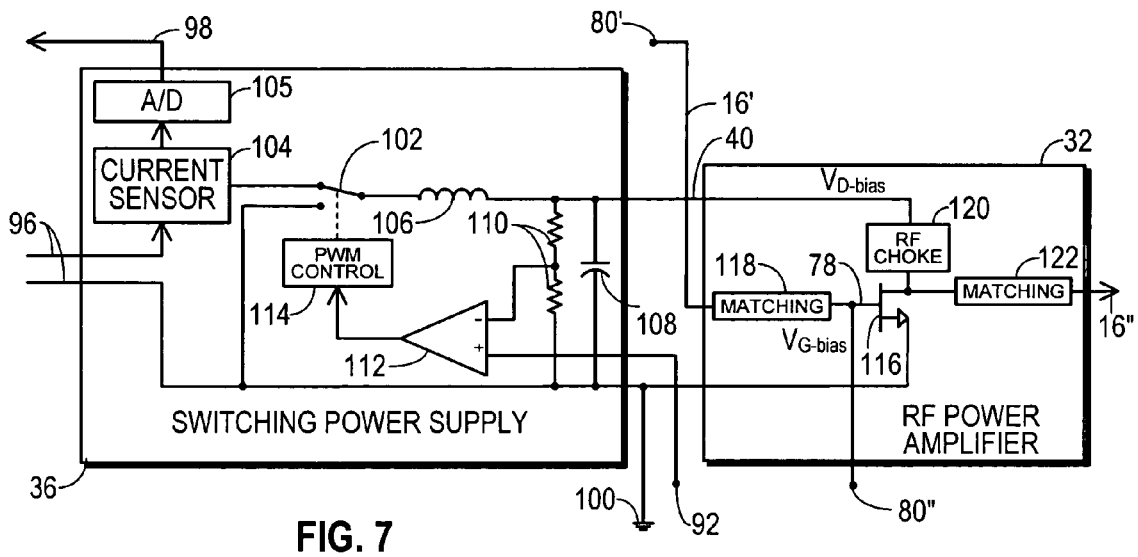
FIG. 7 shows a block diagram explaining further details of a switching power supply and RF power amplifier which may be suitable for use in the RF transmitter of FIG. 3.

FIG. 7 shows a block diagram explaining further details of switching power supply 36, and RF power amplifier 32 which may be suitable for use in the RF transmitter 30. Power is routed to switching power supply 36 at power input 96, which includes a terminal representing a common potential, such as a ground 100, and an opposing polarity terminal.

Desirably, switching power supply 36 uses conventional techniques to convert the DC voltage from power source 94 into a suitable bias voltage for power input 40 of RF power amplifier 32. Conventional techniques are inexpensive, reliable, and efficient, provided that bandwidth limitations are respected as discussed herein. FIG. 7 depicts a simplified functional model of a buck (i.e., voltage reducing) type of switching power supply suitable for use in RF transmitter 30. A switching element 102 is depicted as a single-pole, double-throw switch. One terminal of this switch couples through a series-coupled, current sensor 104 to a positive terminal of power source 94, and another terminal couples to ground 100. A wiper of this switch couples to a first node of an inductor 106, and a second node of inductor 106 provides the output bias voltage from switching power supply 36. Those skilled in the art will appreciate that switching element 102 may desirably be implemented using a couple of FETs.

In the preferred embodiment, current sensor 104 is a low-series-resistance, Hall effect device which consumes little power itself but provides an output indicating the average current drawn from power source 94 by switching power supply 36. When the voltage of power source 94 is relatively constant, this current output is proportional to the total power drawn by RF power amplifier 32. Even when the voltage of power source 94 is not relatively constant, total power can be determined from a voltage monitor (not shown) and current sensor 104.

An analog output of current sensor 104 is converted to a digital signal in an analog-to-digital (A/D) converter 105. Converter 105 provides output 98 from switching power supply 36. Output 98 provides a digital indication of the current being drawn by switching power supply 36 and by power amplifier 32 from power source 94.

A capacitor 108 and a resistor-divider network 110 each couple across the second node of inductor 106 and ground 100. A divider output from network 110 couples to a negative input of a comparison circuit 112, and a positive input of comparison circuit 112 serves as control input 92 of switching power supply 36. An output of comparison circuit 112 couples to a pulse-width modulator (PWM) control section 114 which controls the switching of switching element 102 in a manner well understood by those skilled in the art.

While FIG. 7 depicts a more-or-less conventional, single-phase, buck converter, those skilled in the art will appreciate that other types of switching power supplies may also be used for power supply 36. One of these other types is a boost converter, and another type is a multi-phase converter. A common feature of these types of converters is the use of one or more switching elements 102 that exhibit a maximum switching frequency 20 (FIG. 2) and the implementation of a control loop exhibiting a loop bandwidth 22 (FIG. 2) that is responsive to, and less than, maximum switching frequency 20. And, the output from these types of converters tracks the signal presented at control input 92.

RF power amplifier 32 is provided by any of a variety of semiconductor devices, referred to as device 116 in FIG. 7. FIG. 7 depicts an LDMOS type of device 116, but this is not a requirement. In the preferred embodiment, device 116 is capable of providing amplified RF communication signal 16" at a power level of greater than 5 W, and in many implementations at a power level much greater than 5 W. This power level makes RF power amplifier 32 suitable for use in a cellular basestation application, including a wide bandwidth application in which the frequency band 74 (FIG. 6) is greater than 10 MHz. In accordance with an LDMOS implementation, power input 40 is referred to as the drain, and the bias voltage presented at power input 40 is referred to as $V_{D-bias}$, or just $V_D$. Combining element 78 resides at the output of a matching network 118, which is driven by RF communication signal 16' from output 80' of driver 76 (FIG. 3). Node 80" combines a gate bias voltage $V_{G-bias}$, with RF communication signal 16' after matching network 118. Thus, signal input 80 is provided at a gate of device 116. The signal presented at signal input 80 is a combination of RF communication signal 16' and a gate bias voltage. A source terminal of device 116 couples to ground 100.

RF power amplifier 32 may surround device 116 with other passive components. For example, an RF choke 120 may couple between power input 40 and the actual drain of device 116. The output of RF power amplifier 32 is also provided by the drain of device 116, but a matching network 122 may be interposed between the actual drain of device 116 and the terminal that serves as the output of RF power amplifier 32. While FIG. 7 depicts a simplified diagram of one amplifier, those skilled in the art will appreciate that a wide variety of RF power amplifier configurations may be adapted for use in connection with RF transmitter 30.

Referring back to FIG. 3, a low power output of directional coupler 84 provides a form of amplified RF communication signal 16" to a downconverter 124. In the preferred embodiment, downconverter 124 is implemented as a subharmonic sampling downconverter that simultaneously converts the downconverted signal into a digital signal and which includes a Hilbert transform circuit to convert the digital signal into a complex signal. This type of downconverter is useful in implementing predistortion processing on baseband communication signal 16 in communication signal source 42. Accordingly, although not shown, the complex, digital signal output from subharmonic sampling downconverter 124 may be routed back to communication signal source 42. But the use of this particular type of downconverter and of digital predistortion is not a requirement of RF transmitter 30.

Figure 8:
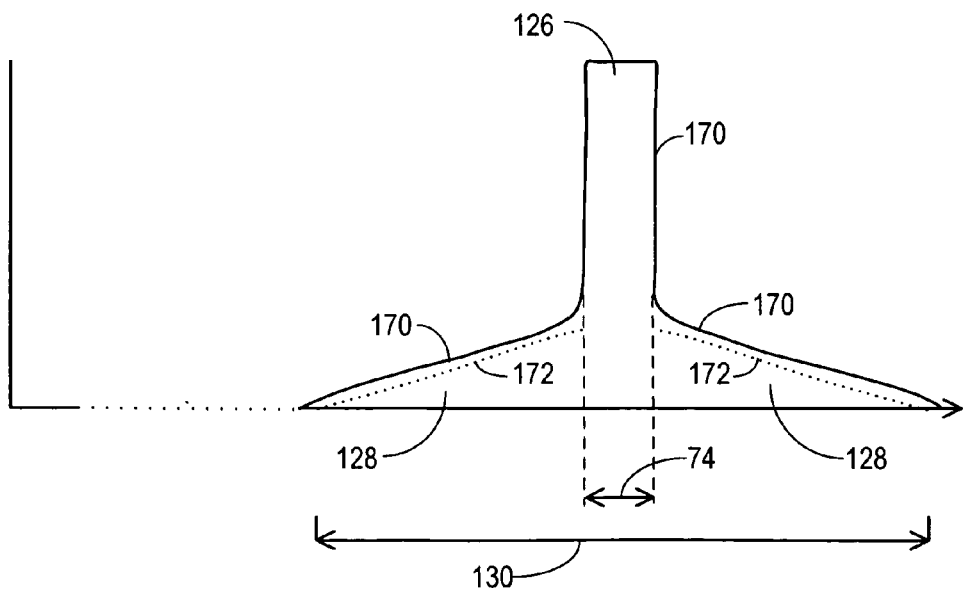
FIG. 8 shows a chart that graphically depicts a spectral plot of an amplified communication signal generated by an RF power amplifier.

FIG. 8 shows a chart that graphically depicts a spectral plot of amplified RF communication signal 16" as generated by RF power amplifier 32. FIG. 8 shows that signal 16" includes in-band power 126 and out-of-band power 128. In-band power 126 resides within allocated frequency band 74 while out-of-band power 128 resides outside of allocated frequency band 74. Total power 130 represents the sum of in-band power 126 and out-of-band power 128. Out-of-band power 128 is unwanted and results in large measure from less than 100% linearity (i.e., some amount of nonlinearity) in the operation of RF power amplifier 32. The bandwidth of signal 16", which encompasses total power 130, is significantly larger than the bandwidth of only allocated frequency band 74. Consequently, the sampling done by subharmonic sampling downconverter 124 is at a sufficient rate to distinguish between in-band power 126 and out-of-band power 128. In other words, the sampling rate for sampling downconverter 124 may be significantly greater than the minimum sampling rate needed to accurately sample the bandwidth of allocated frequency band 74.

Referring to FIGS. 3 and 8, the output from downconverter 124 couples to an input of an out-of-band power estimator 132. Out-of-band power estimator 132 estimates the out-of-band power, which corresponds to the portion of power realized in amplified RF communication signal 16" outside of allocated frequency band 74, and/or total power 130. Preferably, power estimator 132 includes, in one embodiment, both a nonlinear power detector 134 and a linear power detector 136. Total power 130 may then be calculated as being proportional to the sum of in-band power 126 and out-of-band power 128. In another embodiment, power estimator 132 includes both a nonlinear power detector 134 and a total power detector 138. Total power 130 may then be provided directly at an output 140 from total power detector 138.

Nothing requires nonlinear power detector 134 to monitor the entire frequency band outside of allocated band 74 or to provide an absolute power value. Rather, in one embodiment, nonlinear power detector 134 may estimate out-of-band power 128 in one or more relatively small frequency bands located near, but outside of, band 74. The output of such a detector 134 may correspond to the sum of power in each of the bands or the power from the largest one of the bands. In another embodiment, nonlinear power detector 134 may estimate out-of-band power relative to a spectral mask, and the output of detector 134 may correspond to either the integral or average of the out-of-band power relative to the spectral mask over a large portion of the spectrum outside of frequency band 74 or the relative power in a worst-case one of several small frequency bands outside of band 74. These and other techniques which are known to those skilled in the art for distinguishing, in amplified RF communication signal 16", a portion of the power outside of frequency band 74 from a portion of the power inside of frequency band 74 may be used in out-of-band power estimator 132.

Outputs from nonlinear power detector 134 and linear and/or total power detectors 136 or 138 couple to inputs of a ratio section 142. Ratio section 142 may perform a division operation to determine the ratio of out-of-band power 128 to either in-band power 126, total power 130, and/or the spectral mask. Accordingly, in one embodiment an out-of-band power signal 144 expresses out-of-band power 128 as being proportional to one of the out-of-band and in-band powers 128 and 126 and inversely proportional to the other of the out-of-band and in-band powers 128 and 126. In another embodiment out-of-band power signal 144 expresses out-of-band power 128 as being proportional to one of the out-of-band and total powers 128 and 130 and inversely proportional to the other of the out-of-band and total powers 128 and 130. In one preferred embodiment, at each of a set of frequencies outside of frequency band 74, ratio section computes the maximum allowed transmission power by forming the product of the measured in-band power 126 and the spectral mask. Then ratio section 142 forms out-of-band power signal 144 to be the greatest one from the set of frequencies relative to the maximums allowed for those frequencies. In each embodiment, out-of-band power signal 144 desirably conveys a normalized out-of-band power signal.

Out-of-band power signal 144 is also called a linearity signal herein because, in its normalized embodiment, it characterizes the linearity of RF power amplifier 32. More linearity is indicated when out-of-band power 128 is smaller relative to in-band power 126, and less linearity is indicated when out-of-band power 128 is larger relative to in-band power 126.

Due to the expression of out-of-band power as a ratio rather than as an absolute value, an automatic gain control (AGC) loop (not shown) or other power management system may be implemented within RF transmitter 30, and any gain changes resulting from its operation will not significantly influence the effective linearity and efficiency of RF power amplifier 32 in RF transmitter 30.

Out-of-band power signal 144 is provided to a set of tracking/estimation loops that may include: a drain bias tracking (TRK) loop 146, a static gate bias tracking loop 148, a dynamic gate bias tracking loop 150, a drain time constant tracking loop 152, a drain timing window tracking loop 154, a gate time constant tracking loop 156, and a gate timing window tracking loop 158. Output 98 from switching power supply 36, which provides an indication of the current draw of switching power supply and RF power amplifier 32, also couples to inputs of drain bias tracking (TRK) loop 146, static gate bias tracking loop 148, dynamic gate bias tracking loop 150, drain time constant tracking loop 152, drain timing window tracking loop 154, gate time constant tracking loop 156, and gate timing window tracking loop 158. An output of drain bias tracking loop 146 couples to a second input of scaling circuit 88 and closes a feedback loop which includes drain bias tracking loop 146, scaling circuit 88, digital-to-analog converter 90, switching power supply 36, RF power amplifier 32, band-pass filter 82, directional coupler 84, downconverter 124, and out-of-band power estimator 132.

Outputs from peak detector 48 and dynamic gate bias tracking loop 150 couple to inputs of a scaling circuit 160. An output of scaling circuit 160 and an output of static gate bias tracking loop 148 couple to inputs of a summation circuit 162. An output of summation circuit 162 couples to an input of a digital-to-analog converter 164, and an output of digital-to-analog (D/A) converter 164 drives node 80" and couples to a second input of combining element 78. Thus, another feedback loop is presented among static gate bias tracking loop 148, summation circuit 162, digital-to-analog converter 164, combining circuit 78, RF power amplifier 32, band-pass filter 82, directional coupler 84, downconverter 124, and out-of-band power estimator 132. And yet another feedback loop is presented among dynamic gate bias tracking loop 150, scaling circuit 160, summation circuit 162, digital-to-analog converter 164, combining circuit 78, RF power amplifier 32, band-pass filter 82, directional coupler 84, downconverter 124, and out-of-band power estimator 132.

Outputs from drain time constant tracking loop 152 and drain timing window tracking loop 154 couple to inputs of peak detector 44, and outputs from gate time constant tracking loop 156 and drain timing window tracking loop 158 couple to inputs of peak detector 48. Numerous feedback loops along the lines of those outlined above, each of which includes RF power amplifier 32, result. All these feedback loops are controlled through a control section 166. Control section 166 controls the manner by which peak tracking signal 34 and a peak tracking signal 168 output from peak detector 48 influence the bias voltages applied to RF power amplifier 40. Control section 166 includes tracking loops 146, 148, 150, 152, 154, 156, and 158, scaling circuit 160, summation circuit 162, digital-to-analog converter 164, combining circuit 78, scaling circuit 88, and digital-to-analog converter 90.

Referring back to FIG. 8, a regulatory spectral mask 170 is roughly depicted as permitting a first amount of out-of-band power. Often, mask 170 is expressed in a normalized fashion relative to in-band power. Another way of viewing mask 170 is in noting that mask 170 prohibits more than the first amount of out-of-band power. This first amount that is set by spectral mask 170 is depicted by a solid line in FIG. 8. Control section 166 is desirably configured to hold, on the average, the actual out-of-band power produced by RF power amplifier 32 and estimated in out-of-band power estimator 132 at the level of spectral mask 166, or more desirably, slightly beneath spectral mask 166 at a constraint threshold 172.

Figure 9:
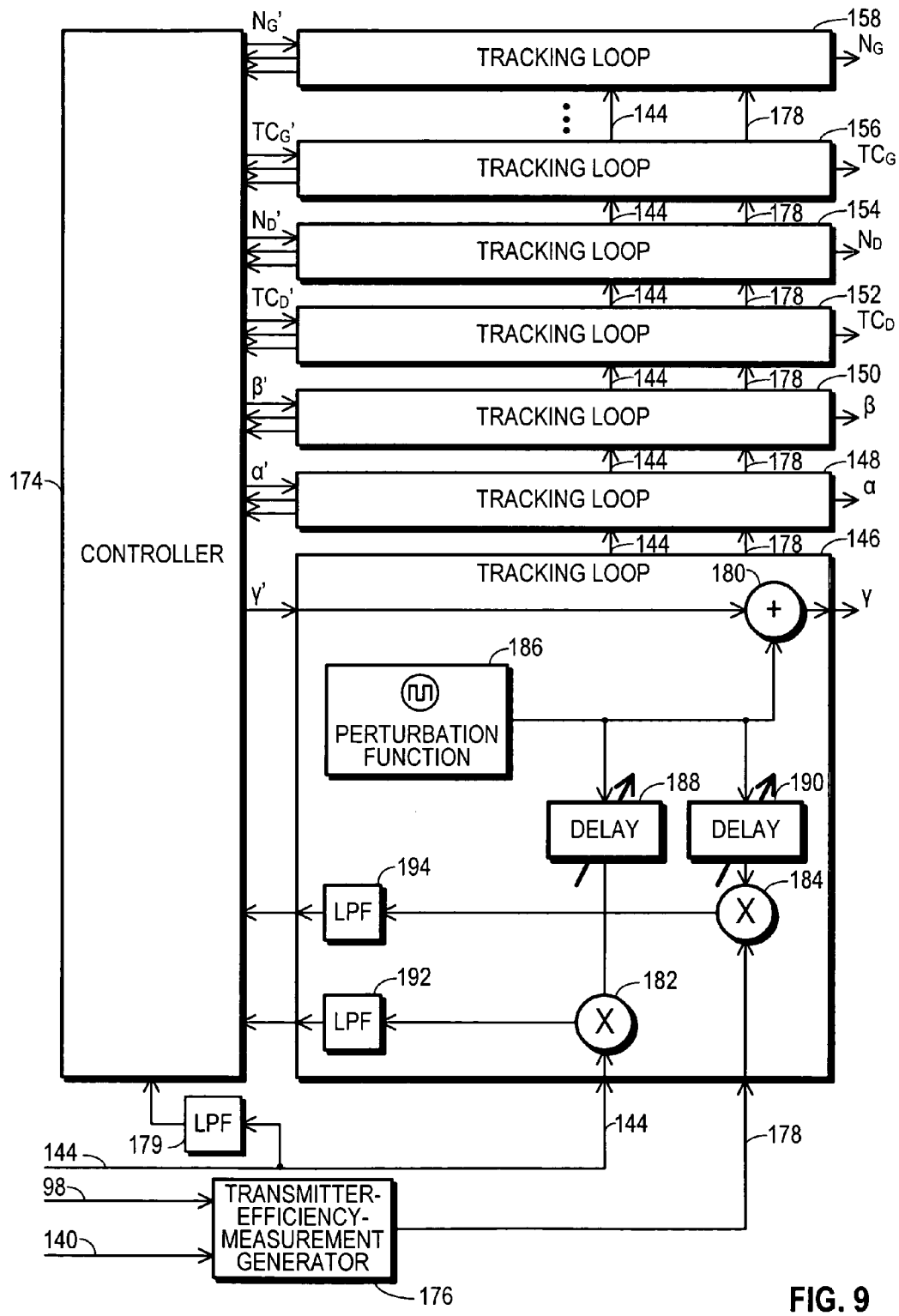
FIG. 9 shows a block diagram of a plurality of tracking loops that may be used within the RF transmitter of FIG. 3.

FIG. 9 shows a block diagram of the core portion of control section 166, including tracking loops 146, 148, 150, 152, 154, 156, and 158. FIG. 9 depicts details only for drain bias tracking loop 146, but all of tracking loops 146, 148, 150, 152, 154, 156, and 158 may be structured like tracking loop 146. FIG. 9 also depicts an embodiment in which all of tracking loops 146, 148, 150, 152, 154, 156, and 158 share a common controller 174 and a common transmitter-efficiency-measurement generator 176.

Transmitter-efficiency-measurement generator 176 has inputs coupled to output 98 from switching power supply 36 (FIG. 3) and output 140 from total power detector 138 (FIG. 3). As discussed above, output 98 provides a digital signal proportional to the total power drawn from power source 94 (FIG. 3) when power source 94 provides a relatively constant voltage. But this is not a requirement, and the voltage of power source 94 may also be monitored (not shown) to generate a more accurate indication of the total power drawn from power source 94 if needed. Also as discussed above, output 140 from total power detector 138 is proportional to the total RF power transmitted by RF power amplifier 32 (FIG. 3). In one embodiment, generator 176 may be implemented by a circuit that performs division operations in which the total RF power transmitted from RF power amplifier 32 is divided by the total power drawn from power source 94 to generate a signal indicative of efficiency. A transmitter efficiency signal 178 presented at an output of transmitter-efficiency-measurement generator 176 digitally conveys the results of these division operations. Those skilled in the art will appreciate that nothing requires transmitter efficiency signal 178 to describe a mathematically precise indication of transmitter efficiency. Rather, transmitter efficiency signal 178 need only be proportional or inversely proportional to actual transmitter efficiency.

Transmitter efficiency signal 178 and linearity signal 144 are inputs to drain bias tracking loop 146 and to tracking loops 148, 150, 152, 154, 156, and 158. Linearity signal 144 is also an input to a low pass filter (LPF) 179 whose output couples to an input of controller 174. A coefficient γ' maintained by controller 174 is also input to drain bias tracking loop 146. Other coefficients (α', β', $TC_D'$, $N_D'$, $TC_G'$, and $N_G'$) are also maintained by controller 174 and supplied to inputs of tracking loops 148, 150, 152, 154, 156, and 158. These plurality of coefficients are independent of one another. In other words, each coefficient may exhibit a different value from the others, and the coefficients need not track one another. These coefficients influence the linearity and efficiency of RF power amplifier 32. Those skilled in the art will appreciate that the precise number of tracking loops and coefficients are not critical features of the present invention. Rather, coefficients are provided for a variety of parameters that influence both transmitter efficiency and RF power amplifier linearity, and a greater number of parameters may be controlled to achieve greater transmitter efficiency while meeting linearity goals, or a lesser number of parameters may be controlled to simplify RF transmitter 30.

Within drain bias tracking loop 146, coefficient γ' is provided to a first input of a summation circuit 180, linearity signal 144 is provided to a first input of a multiplier 182, and transmitter efficiency signal 178 is provided to a first input of a multiplier 184. Tracking loop 146 includes a perturbation function generator 186. In the preferred embodiment, the different instances of tracking loops 146, 148, 150, 152, 154, 156, and 158 use different Walsh-Hadamard sequences as their perturbation functions because these sequences can be orthogonal to each other and easily provided in a digital form. The use of orthogonal sequences substantially prevents the different tracking loops from interfering with one another and allows the influence of each tracking loop from being distinguished from the influences of the other tracking loops. But those skilled in the art can devise other orthogonal perturbation functions that will also work.

A perturbation signal output from perturbation function generator 186 drives a second input of summation circuit 180 and second inputs of multipliers 182 and 184 through respective variable delay elements 188 and 190. Although not shown, control signals from controller 174 to delay elements 188 and 190 establish the amounts of delay the perturbation signal experiences in delay elements 188 and 190. Outputs of multipliers 182 and 184 respectively couple to low pass filters (LPF) 192 and 194, and outputs of low pass filters 192 and 194 provide input signals to controller 174. An output of summation circuit 180 provides a coefficient γ as the control output from tracking loop 146. A similar structure may be provided for each of the other coefficients.

Perturbation function generator 186 desirably generates a low level signal which causes coefficient γ to dither over time in accordance with the particular perturbation function generated by perturbation function generator 186. Desirably, the dithering is a small fraction of the average value of coefficient γ. The dithering of a coefficient, such as coefficient γ, causes the biasing applied to RF power amplifier to dither as well, and this dithering exerts small influences on RF power amplifier linearity and efficiency. For example, the amount of gain applied to lowered-spectrum, peak-tracking signal 34 in scaling circuit 88 will dither a small amount in response to coefficient γ, causing the relationship between bias voltage at power input 40 of RF power amplifier 32 and peak-tracking signal 34 to dither as well. The amount of gain applied to lowered-spectrum, peak-tracking signal 168 in scaling circuit 160 will also dither a small amount in response to coefficient β from tracking loop 150, causing the relationship between bias voltage at signal input 80 of RF power amplifier 32 and peak-tracking signal 168 to dither as well. And, the offset applied to lowered-spectrum, peak-tracking signal 168 in summation circuit 162, which should roughly track the cutoff voltage of device 116 (FIG. 7), will dither a small amount in response to coefficient α from tracking loop 148.

Multipliers 182 and 184 respectively correlate linearity signal 144 and transmitter efficiency signal 178 to the particular perturbation function generated by perturbation function generator 186 and produce results that are proportional to the influence of coefficient γ on RF power amplifier 32 linearity and on transmitter efficiency. Since orthogonal perturbation functions are used in tracking loops 148, 150, 152, 154, 156, and 158, the dithering influence of one coefficient can be distinguished from the dithering influences of the others through these correlation operations. Low pass filters 142 and 144 cause controller 174 to respond to relatively well established influences rather than to mere noise.

Delay elements 188 and 190 temporally align the perturbation signal component of coefficient γ with the return linearity and total power signals 144 and 140. Those skilled in the art will appreciate that in some embodiments the return linearity and total power signals 144 and 140 may have identical timing or be at a fixed delay with respect to one another. In such embodiments, one of delay elements 188 and 190 may be removed and/or replaced by a fixed delay fed by the remaining variable delay element. In the preferred embodiment, output 98 from power supply 36 provides a filtered signal with a low bandwidth that indicates the average current drawn by power supply 36 over a relatively long duration. Thus, no timing alignment issue is presented. But other embodiments may provide a unfiltered or less filtered indication of current; and an additional variable delay element may be included to align this signal with the return total power signal 140.

Each tracking loop generates separate estimates of the derivatives of RF power amplifier linearity with respect to its coefficient and of transmitter efficiency with respect to its coefficient. These derivatives may be expressed as:

$$\frac{dC}{dp_{k\,or\,n}} \text{ and } \frac{dO}{dp_{k\,or\,n}} \qquad \text{EQ. 1}$$

where,
"C" represents the constraint function, defined here as maintaining the RF power amplifier linearity sufficiently high so that spectral mask 170 is not violated,
"O" represents the objective function, defined here as transmitter efficiency, which is desirably maximized without violating the constraint function, and
"$p_{k\,or\,n}$" is the subject one of the plurality of parameters provided by coefficients (γ, α, β, $TC_D$, $N_D$, $TC_G$, and $N_G$), indexed by either an index "k" or an index "n".

Following the chain rule for derivatives, controller 174 converts each pair of derivatives into an estimate of the derivative $\Lambda_{k\,or\,n}$ of RF power amplifier linearity with respect to transmitter efficiency for the subject coefficient, which may be expressed as:

$$\Lambda_{k\,or\,n} \equiv \left(\frac{\Delta C}{\Delta O}\right)_{k\,or\,n} \cong \left(\frac{dC}{dO}\right)_{k\,or\,n} = \frac{(dC/dp_{k\,or\,n})}{dO/dp_{k\,or\,n}}. \qquad \text{EQ. 2}$$

In the preferred embodiment, controller 174 is provided by a microprocessor, microcontroller, or the like, which performs a process defined by software stored in a memory portion of controller 174.

Figure 10:
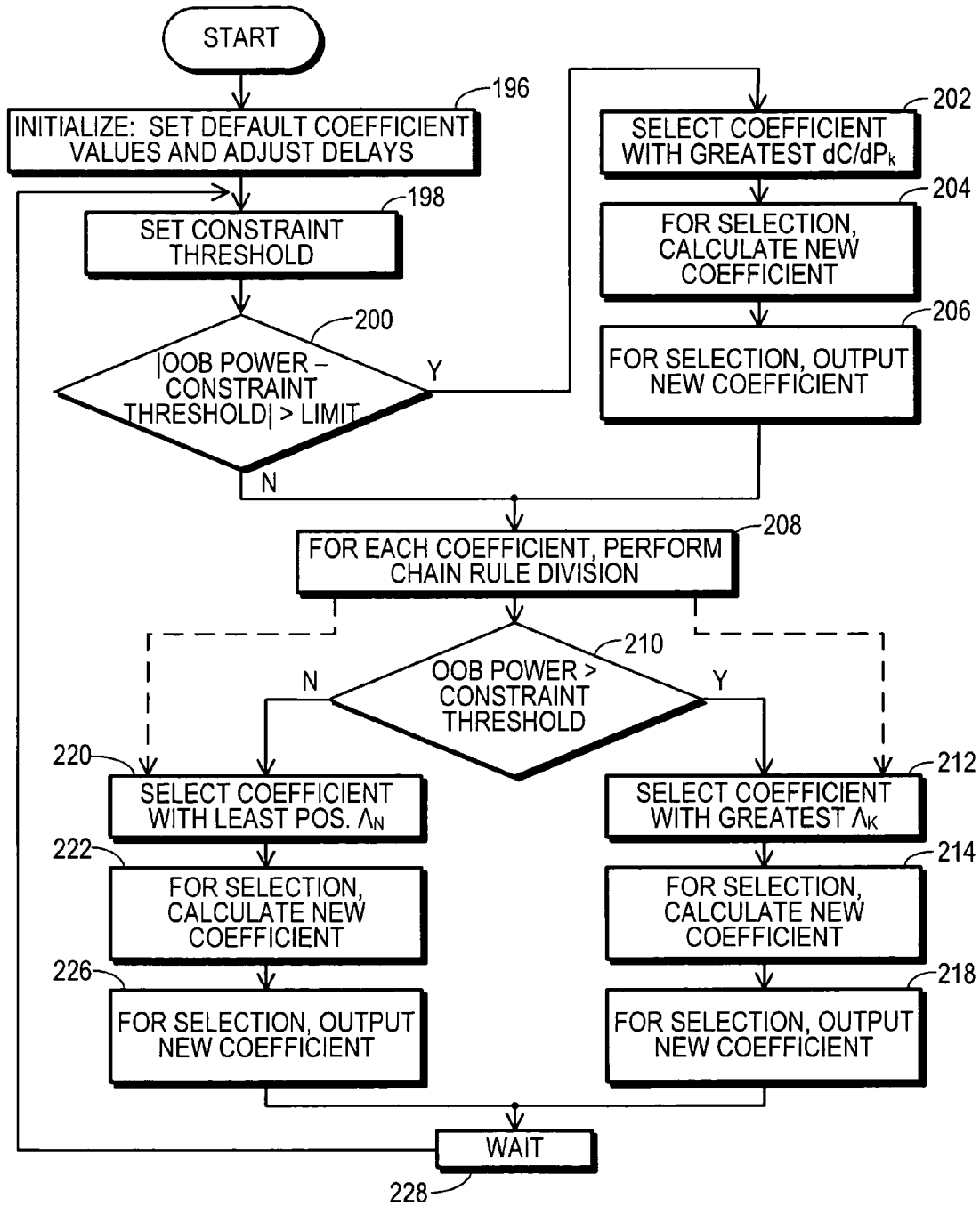
FIG. 10 shows a flow chart of an exemplary control process performed by a controller that may operate in conjunction with the tracking loops of FIG. 9.

FIG. 10 shows a flow chart of an exemplary control process performed by controller 174. This control process includes an initialization task 196 which sets default values for each of the coefficients (e.g., γ, α, β, $TC_D$, $N_D$, $TC_G$, and $N_G$) being maintained by controller 174. The default values may be factory-established constants, the last known values for the coefficients, or the like.

In addition, task 196 adjusts timing elements 188 and 190 (FIG. 9) for each tracking loop to align the loop's perturbation function with the return linearity and transmitter efficiency signals 144 and 178 derived at least in part from the RF communication signal 16" (FIG. 3) generated by RF power amplifier 32 (FIG. 3). Task 196 may be implemented through the use of an adjustment algorithm that varies the delays for a given tracking loop until the partial derivative signals received from that tracking loop exhibit a maximum. Desirably each tracking loop's coefficient is held constant during task 196, except for the small perturbations caused by the loop's perturbation function.

Figure 11:
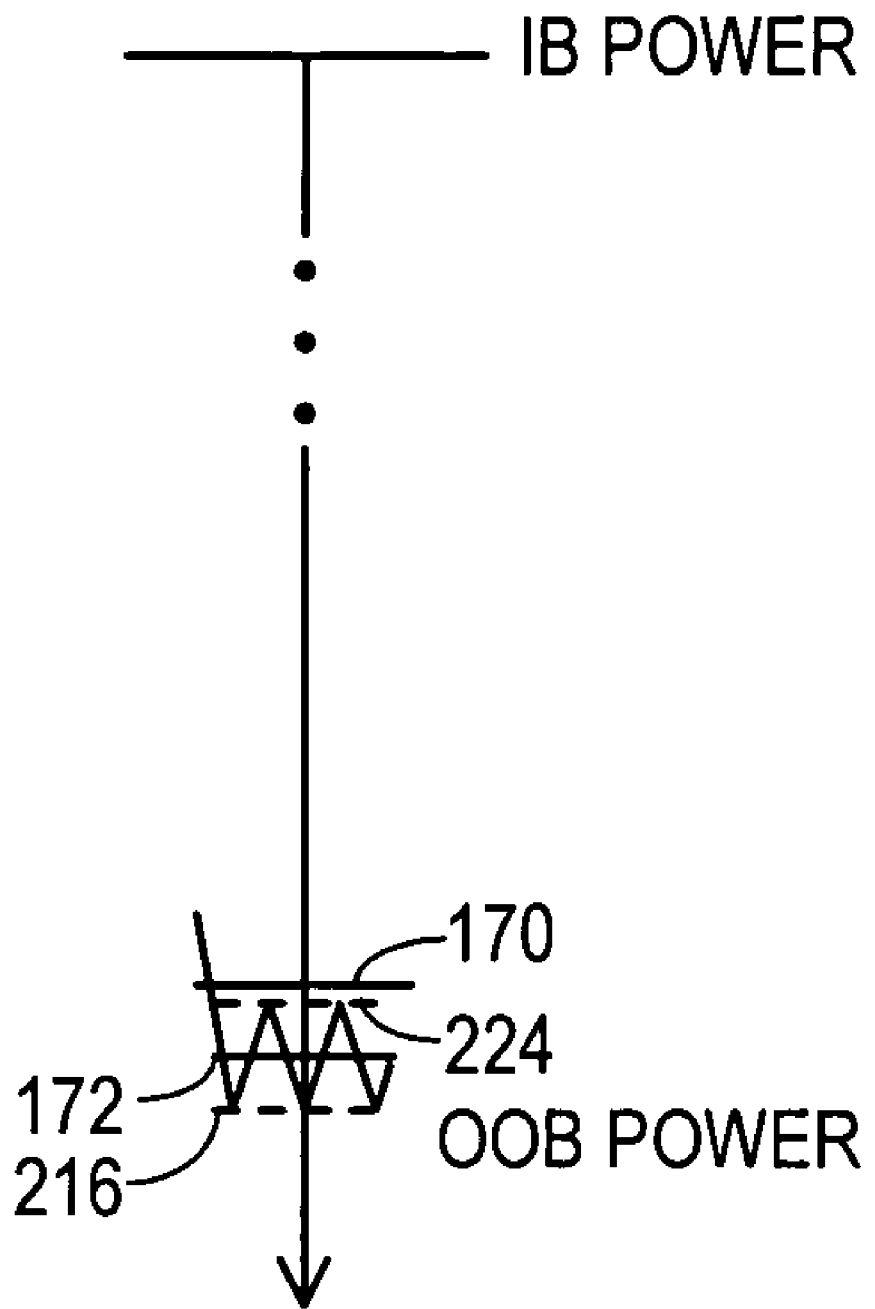
FIG. 11 shows a chart that graphically depicts relative RF power amplitudes managed by the control process of FIG. 10.

FIG. 11 shows a temporal chart that graphically depicts relative RF power amplitudes managed by the control process of FIG. 10. Referring to FIGS. 8, 10, and 11, after task 196, a task 198 is performed to set constraint threshold 172. Desirably, constraint threshold 172 is set near, but slightly beneath spectral mask 170. Spectral mask 170 is expressed as a constant that corresponds to the ratio of maximum permissible out-of-band power 128 to in-band power 126. Accordingly, for comparison purposes spectral mask 170 is compatible with linearity signal 144, which is similarly normalized. Thus, task 198 may set constraint threshold 172 by multiplying the spectral mask by a large fraction. In one embodiment, constraint threshold 172 may initially be set lower by using a smaller fraction, then later adjusted upward, closer to spectral mask 170, and eventually very close to spectral mask 170, as transmitter 30 operates in a steady state condition. And, from time to time, constraint threshold 172 may be randomly set lower and returned to a higher level to reduce the likelihood of control section 166 converging at a local minimum that is greater than other local minima.

Following task 198, a query task 200 determines whether the absolute value of the out-of-band (OOB) power minus constraint threshold 172 exceeds a predetermined limit. In other words, task 200 determines whether transmitter 30 is operating near constraint threshold 172, as it should for normal steady state operation. Desirably, the predetermined limit is set so that task 200 indicates operation too far from the threshold when transmitter 30 is operating above spectral mask 170 or operation far beneath spectral mask 170.

When task 200 discovers operation too far from constraint threshold 172, a task 202 selects the single coefficient that has the greatest absolute value for $dC/dP_k$. This is the coefficient that, when altered, should yield the greatest change in constraint function (i.e., linearity) per unit of coefficient change. This coefficient is selected because priority is given to operation near constraint threshold 172, the constraint function appears to be most sensitive to this coefficient, and adjustment of this coefficient has the greatest likelihood of quickly and effectively moving the constraint function to operate near constraint threshold 172.

After task 202, a task 204 calculates a new coefficient. The new coefficient is calculated using $dC/dP_k$ to cause the constraint function to operate at constraint threshold 172. Next, a task 206 is performed to output the new coefficient for from controller 174 for the selected coefficient. As a result, subsequent operation of transmitter 30 should be near constraint threshold 172.

Referring back to task 200, when task 200 determines that transmitter 30 is operating near constraint threshold 172, a task 208 performs the chain rule division operation for each coefficient. In other words, for each coefficient, the pair of partial derivatives with respect to the coefficient supplied by the subject tracking loop are combined to produce a derivative of RF power amplifier linearity with respect to transmitter efficiency. This combination may result by dividing one of the partial derivatives by the other to produce transaction parameters $\Lambda_k$.

After task 208, a query task 210 determines whether linearity signal 144, filtered through low pass filter 179, indicates that the out-of-band (OOB) power is greater than constraint threshold 172. In other words, task 210 determines whether linearity is less than a predetermined level which corresponds to constraint threshold 172. When out-of-band power is greater than constraint threshold 172, a condition is indicated where the linearity of RF power amplifier 32 is too low, and RF power amplifier 32 is operating too near or perhaps even above spectral mask 170. In this situation, a task 212 selects the single coefficient that has the greatest transaction parameter $\Lambda_k$. In other words, the change in linearity with respect to change in efficiency is greatest for this coefficient at the current operating conditions. This is the coefficient that, when altered, should yield the greatest improvement or increase in linearity per unit of efficiency loss. Of course, those skilled in the art will appreciate that efficiency need not be represented in physical units but that a unit in this context represents a marginal change in efficiency at the current operating conditions.

An alternate selection process may be followed in task 212 in unusual situations. In particular, when at least one of the transaction parameters $\Lambda_k$ exhibits a negative value, an inverse relationship between linearity and efficiency exists for such transaction parameters $\Lambda_k$. In other words, in these unusual situations, a transaction parameter $\Lambda_k$ may indicate that an increase in linearity will be accompanied by an increase in efficiency. In such unusual situations, task 212 may desirably select the transaction parameter $\Lambda_k$ with the negative value, or the one with the smallest negative value when more than one transaction parameter $\Lambda_k$ have negative values (i.e., the most positive among the negative values) exist. For this unusual situation, this is the coefficient that, when altered, should yield the greatest improvement or increase in linearity along with the greatest efficiency gain.

After task 212 a task 214 calculates a new value for the selected coefficient. In particular, the new value is calculated to cause the constraint function (i.e., RF power amplifier linearity) to exceed the level needed to match constraint threshold 172. In other words, with reference to FIG. 11, operation was above constraint threshold 172, and the new value for the selected coefficient is calculated to cause operation below constraint threshold 172. Thus, $$\Delta C \equiv C^{new} - C^{old} \cong -\Delta M \qquad \text{EQ. 3}$$

where,
$C^{new}$=the desired future value for the constraint function,
$C^{old}$=the current value for the constraint function, and
$\Delta M$=the marginal change desired for the constraint function.

FIG. 11 depicts $C^{new}$ for task 214 as being a lower operating limit 216. This value is less than constraint threshold 172. The new value of the selected coefficient "k" may then be calculated as:

$$p_k^{new} \equiv p_k^{old} + \frac{\Delta C}{(dC/dp_k)} = p_k^{old} - \frac{\Delta M}{dC/dp_k} \qquad \text{EQ. 4}$$

and the objective function (i.e., transmitter efficiency) changes by an amount $\Delta O$, where $$\Delta O \cong \left(\frac{\Delta C}{dC/dO}\right)_k = \frac{\Delta C}{\Lambda_k} = \frac{-\Delta M}{\Lambda_k}. \qquad \text{EQ. 5}$$

Following task 214, a task 218 causes the output from controller 174 for the selected coefficient to equal $p_k^{new}$. A transaction of sorts has occurred. An improvement in linearity for RF power amplifier 32 has been "purchased," normally by expending transmitter efficiency. The single coefficient that allowed the greatest amount of linearity to be purchased for the least efficiency cost was altered, and the result should lead to operation beneath constraint threshold 172, and particularly near lower operating limit 216.

When task 210 determines that the out-of-band power is less than or equal to constraint threshold 172, a condition is indicated where the linearity of RF power amplifier 32 too high. In other words, RF power amplifier 32 is operating beneath both spectral mask 170 and the corresponding constraint threshold 172, and spectral mask 170 will permit RF power amplifier 32 to operate with less linearity and still remain in compliance with spectral mask 170. A consequence of the linearity being too high is that efficiency is most likely less than it could be. In this situation, a task 220 selects the single coefficient that has the smallest value from among those transaction parameters $\Lambda_n$ that have positive values. In other words, the change in linearity with respect to change in efficiency is least for this coefficient at the current operating conditions. This is the coefficient that, when altered, should yield the least deterioration or decrease in linearity per unit of efficiency gain.

In highly usual situations, task 220 may discover that no transaction parameter $\Lambda_n$ exhibits a positive value. In this highly unusual situation, it is desirable that no selection be made at task 220. Otherwise, both deterioration in linearity and efficiency loss could be the result from altering any of the transaction parameters $\Lambda_n$.

After task 220 a task 222 calculates a new value for the selected coefficient, if any. In particular, the new value is calculated to cause the constraint function (i.e., RF power amplifier linearity) to be less than the level needed to match constraint threshold 172. In other words, with reference to FIG. 11, operation was below constraint threshold 172, and the new value for the selected coefficient is calculated to cause operation above constraint threshold 172. Thus, $$\Delta C \equiv C^{new} - C^{old} \cong +\Delta M \qquad \text{EQ. 6}$$

FIG. 11 depicts $C^{new}$ for task 22 as being an upper operating limit 224. This value is greater than constraint threshold 172, but desirably less than or equal to spectral mask 170. The new value of the selected coefficient "k" may then be calculated as:

$$p_n^{new} \equiv p_n^{old} + \frac{\Delta C}{(dC/dp_n)} = p_n^{old} + \frac{\Delta M}{dC/dp_n} \qquad \text{EQ. 7}$$

and the objective function (i.e., transmitter efficiency) changes by an amount $\Delta O$, where $$\Delta O \cong \left(\frac{\Delta C}{dC/dO}\right)_n = \frac{\Delta C}{\Lambda_k} = \frac{+\Delta M}{\Lambda_k}. \qquad \text{EQ. 8}$$

Following task 222, a task 226 causes the output from controller 174 for the selected coefficient, if any, to equal $p_n^{new}$. A different type of transaction has occurred from the one described above in connection with task 218. Linearity for RF power amplifier 32 has been "sold" resulting in linearity deterioration. But in return for the linearity deterioration, an increase in efficiency has resulted. The single coefficient that allowed the least amount of linearity to be sold for the greatest efficiency gain was altered, and the result should lead to operation above constraint threshold 170, and particularly near upper operating limit 224.

Following either of tasks 206, 218 or 226, a wait task 228 is performed in which controller 174 does nothing further toward the maintenance of coefficients. Of course, controller 174 could do other unrelated tasks if desired rather than merely wait. The duration of the wait in task 228 is set for compatibility with the update rate of current sensor 104 in power supply 36 (FIG. 7).

Following wait task 228, program control loops back to task 198 to determine whether to change constraint threshold 172 and to perform another transaction where RF power amplifier linearity is either bought or sold in exchange for transmitter efficiency. Over time, such exchanges are repeatedly performed. Different coefficients may be altered in different iterations to effect the above-discussed transactions. For each iteration, one of a plurality of coefficients is selected for alteration so that improvement in linearity is bought at the least cost in efficiency and deterioration in linearity is sold at the greatest gain in efficiency. As a result, compliance with spectral mask 170 is maintained, but within this constraint, alterations are directed toward maximizing efficiency.

The above-presented discussion of the process of FIG. 10 describes an embodiment where one buy or sell transaction takes place per iteration of the programming loop. In an alternate, and more preferred, embodiment both of the buy and sell transactions discussed above take place per iteration. This iteration is illustrated in FIG. 10 by the program flow suggested by dotted lines progressing from task 208 to each of tasks 212 and 220. Each of tasks 212, 214, 218, 220, 222, and 226 are performed per iteration, and task 210 may be omitted. After each iteration, the operation of transmitter 30 should approximate the average of lower limit 216 and upper limit 224, which equals constraint threshold 172. This embodiment converges more quickly, operates with less deviation from constraint threshold 172, and permits constraint threshold 172 to be established closer to spectral mask 170, when compared to the single transaction-per-iteration embodiment.

In summary, the present invention provides, in at least one embodiment, an improved RF transmitter with a variably biased RF power amplifier and a corresponding method of operating an RF transmitter. For at least one embodiment, the variably biased RF transmitter and method are suited for use in a high power, wide bandwidth application, such as a cellular basestation. The transmitter and method, in at least one embodiment, actively manage RF power amplifier linearity to achieve as much RF power amplifier efficiency as practical while meeting regulatory spectral mask requirements. The transmitter and method, in at least one embodiment, actively manage RF power amplifier linearity to maintain out-of-band power below or equal to a predetermined level so that regulatory spectral mask requirements can be maintained. The transmitter and method, in at least one embodiment, actively manage RF power amplifier linearity to maintain out-of-band power above or equal to a predetermined level so that as much RF power amplifier efficiency enhancement as possible can be achieved without violating regulatory spectral mask requirement. And, the transmitter and method, in at least one embodiment, provide a variably biased RF power amplifier and method which repeatedly make linearity/efficiency transactions. When linearity may be degraded, linearity is "sold" in exchange for as much efficiency gain as possible, and when linearity needs to be improved, linearity is "bought" in exchange for as little efficiency loss as possible.

Although the preferred embodiments of the invention have been illustrated and described in detail, it will be readily apparent to those skilled in the art that various modifications may be made therein without departing from the spirit of the invention or from the scope of the appended claims. For example, in one modification peak detector 48 may be entirely omitted and delay elements 46 and 50 combined. In this modification, peak detector 44 may drive scaling circuit 160. In another modification, bias control may be extended to driver 76. For example, the power input bias voltage to driver 76 (not shown) may also be supplied by switching power supply 36. These and other modifications and adaptations which are obvious to those skilled in the art are to be included within the scope of the present invention.

What is claimed is:

1. An RF transmitter configured to transmit an RF signal within a predetermined frequency band using a variably biased RF power amplifier, said RF transmitter comprising:
   a power source;
   an RF power amplifier having a power input, a signal input, and a signal output;
   a switching element coupled between said power source and said power input of said RF power amplifier, said switching element supplying a bias voltage to said RF power amplifier;
   a communication-signal source configured to supply a communication signal, said communication-signal source being coupled to said signal input of said RF power amplifier;
   a peak detector having an input coupled to said communication-signal source and an output;
   an out-of-band power estimator having an input coupled to said output of said RF power amplifier and having an output, said out-of-band power estimator being configured to estimate power occurring outside of said predetermined frequency band; and
   a control section having a first input coupled to said output of said peak detector, a second input coupled to said output of said out-of-band power estimator, and an output coupled to said switching element, said control section being configured to adjust said bias voltage supplied to said RF power amplifier so that said out-of-band power estimated by said out-of-band power estimator is less than or equal to a predetermined power level.

2. An RF transmitter as claimed in claim 1 wherein:
   said control section includes a transmitter-efficiency-measurement generator configured to generate a signal responsive to transmitter efficiency; and
   said control section is configured to adjust said bias voltage in response to said transmitter-efficiency-measurement generator.

3. An RF transmitter as claimed in claim 1 wherein said out-of-band power estimator is configured to generate a signal describing RF power amplifier linearity.

4. An RF transmitter as claimed in claim 1 wherein said control section is configured to estimate a derivative of RF power amplifier linearity with respect to transmitter efficiency.

5. An RF transmitter as claimed in claim 1 wherein:
   said control section is configured to generate a plurality of coefficients that influence RF power amplifier linearity and that influence transmitter efficiency; and
   said control section is further configured so that when RF power amplifier linearity exceeds a predetermined level, said control section selects one of said plurality of coefficients to alter, said selected one of said coefficients being the one that exerts the least influence over RF power amplifier linearity per unit of transmitter efficiency.

6. An RF transmitter as claimed in claim 5 wherein said control section is configured to alter said selected one of said coefficients by an amount calculated to cause said RF power amplifier linearity to be less than said predetermined level.

7. An RF transmitter as claimed in claim 1 wherein:
said control section is configured to generate a plurality of coefficients that influence RF power amplifier linearity and that influence transmitter efficiency; and
said control section is further configured so that when RF power amplifier linearity is less than a predetermined level, said control section selects one of said plurality of coefficients to alter, said selected one of said coefficients being the one that exerts the greatest influence over RF power amplifier linearity per unit of transmitter efficiency.

8. An RF transmitter as claimed in claim 7 wherein said control section is configured to alter said selected one of said coefficients by an amount calculated to cause said RF power amplifier linearity to exceed said predetermined level.

9. An RF transmitter as claimed in claim 1 wherein:
said control section is configured to generate a plurality of coefficients each of which influences RF power amplifier linearity and transmitter efficiency;
said control section is further configured to cause each of said coefficients to dither over time in accordance with a perturbation function substantially orthogonal to other ones of said perturbation functions; and
said control section is further configured, for each of said coefficients, to correlate a signal describing RF power amplifier linearity with said perturbation function for said coefficient and to correlate a signal describing transmitter efficiency with said perturbation function for said coefficient.

10. An RF transmitter as claimed in claim 1 wherein said communication-signal source is configured to provide a communication signal exhibiting a bandwidth of greater than 10 MHz.

11. An RF transmitter as claimed in claim 1 wherein said power source, said RF power amplifier, said switching element, and said control section are mutually configured so that an amplified communication signal output by said RF power amplifier exhibits greater than 5 Watts.

12. An RF transmitter as claimed in claim 1 wherein:
said communication signal exhibits a bandwidth; and
said switching element switches at a frequency less than one-fifth said bandwidth.

13. An RF transmitter as claimed in claim 1 wherein:
said predetermined power level is a first predetermined power level; and
said control section is configured to maintain said out-of-band power estimated by said out-of-band power estimator to be greater than or equal to a second predetermined power level.

14. An RF transmitter as claimed in claim 1 wherein:
said out-of-band power estimator provides an out-of-band power signal at its output;

said out-of-band power estimator includes a first power detector that estimates out-of-band power and a second power detector that estimates in-band power; and
said out-of-band power estimator includes a ratio section that generates said out-of-band power signal to be proportional to one of said out-of-band and in-band powers and inversely proportional to the other of said out-of-band and in-band powers.

15. An RF transmitter as claimed in claim 1 wherein:
said out-of-band power estimator provides an out-of-band power signal at its output;
said out-of-band power estimator includes a first power detector that estimates out-of-band power and a second power detector that estimates total power; and
said out-of-band power estimator includes a ratio section that generates said out-of-band power signal to be proportional to one of said out-of-band and total powers and inversely proportional to the other of said out-of-band and total powers.

16. An RF transmitter as claimed in claim 1 wherein:
said communication signal exhibits a bandwidth and a varying magnitude; and
said peak detector generates a lowered-spectrum, peak-tracking signal that is responsive to said varying magnitude of said communication signal and that exhibits a fundamental frequency less than said communication signal bandwidth.

17. An RF transmitter as claimed in claim 1 wherein:
said output of said control section is a first output and said bias voltage supplied by said switching element is a first bias voltage; and
said control section has a second output coupled to said signal input of said RF power amplifier to provide a second bias voltage to said signal input of said RF power amplifier; and
said control section is configured to adjust said second bias voltage supplied to said signal input of said RF power amplifier in response to said out-of-band power detected by said out-of-band power estimator so that said out-of-band power is less than or equal to said predetermined power level.

18. An RF transmitter as claimed in claim 17 wherein:
said peak detector is a first peak detector and is configured to generate a first lowered-spectrum, peak-tracking signal that exhibits a first fundamental frequency;
said control section is configured so that said first bias voltage is responsive to said first lowered-spectrum, peak-tracking signal;
said RF transmitter additionally comprises a second peak detector having an input coupled to said communication-signal source and an output coupled to said control section, said second peak detector being configured to generate a second lowered-spectrum, peak-tracking signal that exhibits a second fundamental frequency which is greater than said first fundamental frequency; and
said control section is configured so that said second bias voltage is responsive to said second lowered-spectrum, peak-tracking signal.

* * * * *